(12) United States Patent
Ozkan et al.

(10) Patent No.: US 7,132,787 B2
(45) Date of Patent: Nov. 7, 2006

(54) MULTILAYER POLYMER-QUANTUM DOT LIGHT EMITTING DIODES AND METHODS OF MAKING AND USING THEREOF

(75) Inventors: Mihri Ozkan, San Diego, CA (US); Sumit Chaudhary, Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 138 days.

(21) Appl. No.: 10/716,415

(22) Filed: Nov. 20, 2003

(65) Prior Publication Data

US 2005/0001538 A1 Jan. 6, 2005

Related U.S. Application Data

(60) Provisional application No. 60/464,118, filed on Apr. 21, 2003, provisional application No. 60/428,036, filed on Nov. 20, 2002.

(51) Int. Cl.
*H01J 1/72* (2006.01)
*H01J 63/04* (2006.01)

(52) U.S. Cl. .......................... 313/503; 257/40
(58) Field of Classification Search ................ 313/503; 257/13, 14
See application file for complete search history.

(56) References Cited

U.S. PATENT DOCUMENTS

| | | | | |
|---|---|---|---|---|
| 6,157,047 A | * | 12/2000 | Fujita et al. | 257/51 |
| 6,236,060 B1 | * | 5/2001 | Chan et al. | 257/13 |
| 6,391,482 B1 | * | 5/2002 | Matsuo et al. | 428/690 |
| 6,444,143 B1 | * | 9/2002 | Bawendi et al. | 252/301.6 S |
| 6,475,364 B1 | * | 11/2002 | Dubrow et al. | 204/455 |
| 6,572,784 B1 | * | 6/2003 | Coombs et al. | 252/301.16 |
| 6,797,412 B1 | * | 9/2004 | Jain et al. | 428/690 |
| 6,803,719 B1 | * | 10/2004 | Miller et al. | 313/501 |

* cited by examiner

*Primary Examiner*—Edward J. Glick
*Assistant Examiner*—Anastasia S. Midkiff
(74) *Attorney, Agent, or Firm*—Suzannah K. Sundby, Esq.; Smith, Gambrell & Russell, LLP

(57) ABSTRACT

Disclosed herein are multilayer polymer-quantum dot light emitting diodes (PQD-LEDs) and methods of making thereof. As disclosed, the PQD-LEDs comprise at least one quantum dot layer made from an aqueous suspension of quantum dots upon which a polymer layer is deposited by spin coating methods known in the art. The quantum dot layers and the polymer layers are discrete and distinct from one another. Also disclosed are methods of making the PQD-LEDs of the present invention and kits.

29 Claims, 6 Drawing Sheets

MULTILAYER POLYMER-QUANTUM DOT LIGHT EMITTING DIODES AND METHODS OF MAKING AND USING THEREOF

CROSS REFERENCE TO RELATED APPLICATIONS

This application claims the benefit of U.S. Provisional Patent Application Nos. 60/428,036, filed 20 Nov. 2002, and 60/464,118, filed 21 Apr. 2003, both of which list Mihri Ozkan and Sumit Chaudhary as the inventors, and are herein incorporated by reference in their entirety.

BACKGROUND OF THE INVENTION

1. Field of the Invention

The present invention generally relates to multilayer polymer-quantum dot light emitting diodes (PQD-LED) and methods of making and using thereof.

2. Description of the Related Art

Polymer-quantum dot light emitting diodes (PQD-LED) have caught immense attention in the LED research and commercial communities by virtue of the marriage of easy processability and ruggedness of polymers and exotic optical properties of quantum dots (QDs). Many unilayer and bilayer PQD-LEDs have been reported. See Colvin, V. L., et al. (1994) Nature 370:354; Dabbousi, B. O., et al. (1995) Appl. Phys. Lett. 66:1316; Mattousi, H., et al. (1998) J. Appl. Phys. 83:7965–7974; and Schlamp, M. C., et al. (1997) J. Appl. Phys. 82:5837–5842. Unilayer PQD-LEDs have conductive and emissive species mixed together and are far below the theoretical performance limits. Bilayer LEDs perform better than unilayer devices. Unfortunately, bilayer LEDs employ the QD layer as both emissive and electron conducting layer which creates imbalance in charge conduction due to poor conductivity of these colloidal QDs. See Leatherdale, C. A., et al. (2000) Phys. Rev. B. 62:2669–2680. Further in bilayer LEDs the emissive QD layer is next to the metal electrode which causes quenching of emission See Wu, C. C., et al. (1997) IEEE Trans. Electron Devices 44(8):1269; and Becker, H. (1997) Phys. Rev. B 56:1893–1905. Some researchers have also demonstrated PQD-LEDs by electrostatic self assembly, but this process involves a large number of steps and also relies on polycations or polyanions, which are charged and are reported to cause quenching of emission See Chen, W., et al. (2002) Nanosci. Nanotech. 2:47–53; Lee, J., et al. (2001) J. Nanosci. Nanotech. 1:59–63; Gao, M., et al. (2000) J. Appl. Phys. 87:2297–2302; and Onisuka, O., et al. (1996) J. Appl. Phys. 80:4067. Recently, trilayer hybrid organic molecule-QD LED was demonstrated See Coe, S., et al. (2002) Nature 420:800. Unfortunately, the fabrication of the organic molecule-QD LEDs relies on phase segregation techniques based on differences in size and chemistry of the QDs and organic molecules, and is therefore only applicable for organic molecule-QD LEDs and not PQD-LEDs. Further, the methods for making the organic molecule-QD LED is not viable for sandwiching multilayers of QDs between organic layers, as phase segregation of QDs towards the top of organic molecule layer will not occur if the amount of QDs is more than one or few monolayers. Emission from only one monolayer of QDs may not satisfy the high brightness requirements of commercial applications.

Thus, a need exists for a multilayer PQD-LED and methods for making thereof.

SUMMARY OF THE INVENTION

The present invention generally relates to multilayer PQD-LEDs and methods for making thereof.

In some embodiments, the present invention provides a multilayer PQD-LED comprising at least one QD layer between a first polymer layer and a second polymer layer or an organic molecule layer. In some embodiments, the QD layer was formed using an aqueous suspension of QDs. In some embodiments, the aqueous suspension of QDs is stable, e.g. does not degrade or retains its functionality in a dark, dry atmosphere for at least 1 year or more, preferably at least 5 years or more, more preferably at least 10 years or more, most preferably an infinite period of time. In some embodiments, the QDs are hydrophillic. In some embodiments, the QD layer is about 1 to about 4, preferably about 1 to about 3, more preferably about 1 to about 2, monolayers thick. In some embodiments, the organic molecule layer comprises a low molecular weight compound selected from the group consisting of polyaromatics and polyheteroaromatics. In some embodiments, the organic molecule layer comprises a high molecular weight compound selected from the group of conjugated polymers and non-conjugated polymers. In some embodiments, at least one of the polymer layers comprises a high molecular weight compound selected from the group consisting of non-conjugated polymers and conjugated polymers. In some embodiments, the first polymer layer comprises a hole conducting polymer. In some embodiments, the second polymer layer comprises an electron conducting polymer. In some embodiments, the first polymer layer comprises polyvinyl carbazole (PVK). In some embodiments, the second polymer layer comprises tu-PBD. In some embodiments, the QDs comprise a first element selected from Groups 2 and 12 of the Periodic Table of the Elements and a second element selected from Group 16. In some embodiments, the QDs comprise a first element selected from Group 13 of the Periodic Table of the Elements and a second element selected from Group 15. In some embodiments, the QDs comprise an element selected from Group 14 of the Periodic Table of the Elements. In some embodiments, the QDs comprise an outer surface which is hydrophilic. In some preferred embodiments, the QDs comprise ZnS capped CdSe QDs. In some embodiments, the second polymer layer was deposited by spin coating. In some embodiments, the QD layers are alternating layers of QDs that are soluble in aqueous solvents or organic solvents. In some embodiments, at least one QD layer is deposited on top of the second polymer layer.

In some embodiments, the multilayer PQD-LED of the present invention comprises alternating layers of QD layers and polymer layers, wherein the QD layers are soluble in aqueous solvents and the polymer layers are soluble in organic solvents. In some embodiments, one of the QD layers comprises QDs that are the same or different from QDs in another QD layer.

In some preferred embodiments, the multilayer PQD-LED of the present invention comprises a first polymer layer which comprises PVK, at least one QD layer which comprises an aqueous suspension of ZnS capped CdSe QDs, and a second polymer layer which comprises tu-PBD that was deposited on the QD layer by spin coating.

In some embodiments, the present invention provides a method of making the multilayer PQD-LEDs of the present invention, which comprises depositing the QD layer on a first polymer layer and then depositing a second polymer layer on a QD layer by spin coating. In some embodiments, the method further comprises depositing the QD layer as an aqueous suspension of QDs. In some embodiments, the method further comprises making te aqueous suspension of QDs by making the QDs hydrophilic.

In some embodiments, the present invention provides a device which comprises a multilayer PQD-LED of the present invention.

In some embodiments, the present invention provides a kit which comprises a multilayer PQD-LED of the present invention and instructional material.

In some embodiments, the present invention provides a kit which comprises at least one reagent for making the multilayer PQD-LED of the present invention and instructional material. In some preferred embodiments, the reagent is an aqueous suspension of QDs.

It is to be understood that both the foregoing general description and the following detailed description are exemplary and explanatory only and are intended to provide further explanation of the invention as claimed. The accompanying drawings are included to provide a further understanding of the invention and are incorporated in and constitute part of this specification, illustrate several embodiments of the invention and together with the description serve to explain the principles of the invention.

DESCRIPTION OF THE DRAWINGS

This invention is further understood by reference to the drawings wherein.

DETAILED DESCRIPTION OF THE INVENTION

Figure 1:
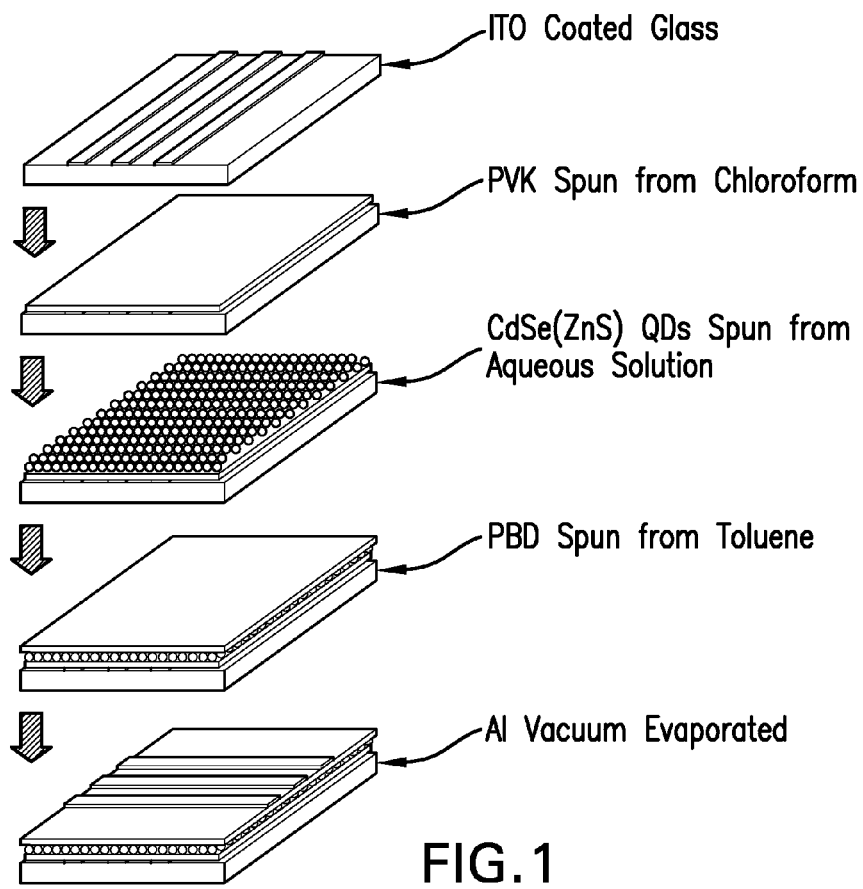
FIG. 1 shows the method of the present invention for fabricating a trilayer PQD-LED.

The present invention provides a multilayer polymer-quantum dot light emitting diode (PQD-LED) comprising a quantum dot (QD) layer between a first polymer layer and a second polymer layer.

The multilayer PQD-LEDs and methods of making the multilayer PQD-LEDs of the present invention may be used in full color, voltage tunable, bright and highly efficient PQD-LEDs for use in portable devices such as cellular phones, digital video cameras, DVD players, and PDAs, large area displays, head mounted displays for wearable computers, helmet mounted displays for defense, fabric displays, and the like.

When a range of values is recited, it is to be understood that each intervening integer value, and each fraction thereof, between the recited upper and lower limits of that range is also specifically disclosed, along with each sub-range between such values. The upper and lower limits of any range can independently be included in or excluded from the range, and each range where either, neither or both limits are included is also encompassed within the invention. When a value being discussed has inherent limits, for example if a component can be present at a concentration of from 0 to 100%, or if the pH of an aqueous solution can range from 1 to 14, those inherent limits are specifically disclosed. When a value is explicitly recited, it is to be understood that values, which are about the same quantity or amount as the recited value, are also within the scope of the invention. When a combination is disclosed, each subcombination of the elements of that combination is also specifically disclosed and is within the scope of the invention. Conversely, when different elements or groups of elements are disclosed, combinations thereof are also disclosed. When any element of an invention is disclosed as having a plurality of alternatives, examples of that invention in which each alternative is excluded singly or in any combination with the other alternatives are also hereby disclosed; more than one element of an invention can have such exclusions, and all combinations of elements having such exclusions are hereby disclosed.

As used herein, the term "nanoparticle", "nanostructure", "nanocrystal", "quantum dot", and "nanocomponent" are used interchangeably to refer to a particle, generally a semiconductive or metallic particle, having a diameter in the range of about 1 nm to about 1000 nm, preferably in the range of about 2 nm to about 50 nm, more preferably in the range of about 2 nm to about 20 nm (for example about 2, 3, 4, 5, 6, 7, 8, 9, 10, 11, 12, 13, 14, 15, 16, 17, 18, 19, or 20 nm). Nanostructures include molecular beacons (MBs), quantum dots (QDs), carbon nanotubes (CNTs), nanowires, colloidal nanocrystals, colloidal polymers, colloidal metal or semiconductor particles, hollow or filled nanobars, magnetic, paramagnetic, conductive or insulating nanoparticles, synthetic particles, hydrogels (colloids or bars), and the like. A QD has size dependent properties, e.g. chemical, optical, and electrical properties, along three orthogonal dimensions. A QD can be differentiated from a quantum wire and a quantum well, which have size-dependent properties along at most one dimension and two dimensions, respectively. It will be appreciated by one of ordinary skill in the art that QDs can exist in a variety of shapes, including but not limited to spheroids, rods, disks, pyramids, cubes, and a plurality of other geometric and non-geometric shapes. While these shapes can affect the physical, optical, and electronic characteristics of QDs, the specific shape does not bear on the qualification of a particle as a QD. A QD typically comprises a "core" of one or more first materials and can optionally be surrounded by a "shell" of a second material. Although ZnS capped CdSe QDs are exemplified herein, other suitable QDs such as CdTe, $TiO_2$, and the like may be used according to the present invention. In some preferred embodiments, the QDs of the present invention are ZnS capped CdSe QDs. N-type QDs can be made by successful electron transfer from sodium biphenyl to the LUQCO (Lowest Unoccupied Quantum-Confined Orbital) of the nanocrystals. See Shim, M. et al. (2000) Nature 407:981, which is herein incorporated by reference.

Suitable materials for the core and/or shell of QDs, include a first element selected from Groups 2 and 12 of the Periodic Table of the Elements and a second element selected from Group 16 (e.g., ZnS, ZnSe, ZnTe, CDs, CdSe, CdTe, HgS, HgSe, HgTe, MgS, MgSe, MgTe, CaS, CaSe, CaTe, SrS, SrSe, SrTe, BaS, BaSe, BaTe, and the like); materials comprised of a first element selected from Group 13 of the Periodic Table of the Elements and a second element selected from Group 15 (GaN, GaP, GaAs, GaSb, InN, InP, InAs, InSb, and the like); materials comprised of a Group 14 element (Ge, Si, and the like); materials such as PbS, PbSe and the like; and alloys and mixtures thereof. As used herein, all reference to the Periodic Table of the Elements and groups thereof is to the new IUPAC system for numbering element groups, as set forth in the Handbook of Chemistry and Physics, 81st Edition (CRC Press, 2000), which is herein incorporated by reference.

The QDs of the present invention may be optionally surrounded by an organic capping agent. The organic capping agent may be any number of materials, but has an affinity for the QD surface. In general, the capping agent can be an isolated organic molecule, a polymer (or a monomer for a polymerization reaction), an inorganic complex, or an extended crystalline structure. The coat can be used to convey solubility, e.g. the ability to disperse a coated QD homogeneously into a chosen solvent, functionality, binding properties, or the like. In addition, the coat can be used to tailor the optical properties of the QD. Colloidal QDs may also be used as they have a solution processibility of polymers and it can be laid into thin films by simple techniques like spin coating, dip coating and electrostatic layer by layer assembly. The QDs in a QD layer may be in the form of a monolayer, randomly mixed, duplex, triplex, or multiplex groups of FRET couples formed with different color or material types.

For oligomeric light emitting diodes (OLEDs), the layers comprise low molecular weight compounds known in the art such as polyaromatics such as anthracene derivatives, perylene derivatives, stilbene derivatives, and the like, and polyhetero-aromatics such as oxazoles, oxadiazoles, thiazoles, and the like. For polymer light emitting diodes (PLEDs) the layers comprise high molecular weight compounds known in the art such as like non-conjugated polyvinylcarbazole derivatives (PVK) and conjugated polymers like poly(p-phenylene vinylenes) (PPV), poly(3-alkylothiophene), poly(p-phenylene ethynylenes), and the like. These polymers are used as hole transport species in the layer next to positive electrode. Flourene based copolymers containing quinoline (POF66, P1F66) and pyridine (PFPV) units can be used as electron transport species in the layer next to a negative electrode.

In some preferred embodiments, the present invention provides a multilayer PQD-LED comprising a quantum dot layer between a layer of polyvinylcarbazole (PVK) and a layer of an oxadiazole derivative (tu-PBD).

The multilayer PQD-LED of the present invention may be attached to or deposited on a substrate. As used herein, the terms "substrate" and "support" are used interchangeably. The substrate can comprise a wide range of material such as biological material, nonbiological material, organic material, inorganic material, and the like, or a combination of any of these. For example, the substrate may be a polymerized Langmuir Blodgett film, functionalized glass, Si, Ge, GaAs, GaP, $SiO_2$, $SiN_4$, modified silicon, or any one of a wide variety of gels or polymers such as (poly)tetrafluoroethylene, (poly)vinylidenedifluoride, polystyrene, cross-linked polystyrene, polyacrylic, polylactic acid, polyglycolic acid, poly(lactide coglycolide), polyanhydrides, poly(methyl methacrylate), poly(ethylene-co-vinyl acetate), polysiloxanes, polymeric silica, latexes, dextran polymers, epoxies, polycarbonate, and the like, or combinations thereof. The substrates may be planar crystalline substrates such as silica based substrates including glass, quartz, or the like, or crystalline substrates such as those used in the semiconductor and microprocessor industries which include silicon, gallium, arsenide, and the like. Silica aerogels can also be used as substrates, and can be prepared by methods known in the art. Aerogel substrates may be used as free-standing substrates or as a surface coating for another substrate material.

The substrate may be in any form and typically is a plate, slide, bead, pellet, disk, particle, strand, precipitate, membrane, optionally porous gel, sheets, tube, sphere, container, capillary, pad, slice, film, chip, multiwell plate or dish, optical fiber, or the like. The surface of the substrate can be etched using well known techniques to provide for desired surface features such as trenches, v-grooves, mesa structures, and the like. The surfaces on the substrate can comprise the same material as the substrate or may be made from a material different from the substrate which may be affixed thereto by chemical or physical methods known in the art. The materials of the substrate surfaces may comprise a variety of materials such as polymers, plastics, resins, polysaccharides, silica or silica-based materials, carbon, metals, inorganic glasses, membranes, or any of the above-listed substrate materials.

As exemplified herein, the substrate is a 1 inch glass substrate. However, the substrate may be a flexible substrate like plastic, paper, and the like. In some embodiments, the substrate may be a opaque metal in which case the topmost electrode allows light to pass therethrough. One skilled in the art may readily select the substrate and/or substrate surface materials in order to obtain a desired characteristic using methods and know-how in the art.

As disclosed herein, all the layers were deposited by controlled spin coating methods known in the art. See Mattousi, H., et al. (1998) 83:7965–7974, which is herein incorporated by reference. However, it should be noted that the second organic layer over the QD layer is deposited using spin coating method, other known methods such as electrostatic self assembly, vacuum deposition and dip coating may be used to deposit further layers of the multilayer PQD-LED of the present invention. For example, the first polymer layer may be formed by electrostatic self assembly, then the QD layer is deposited by dip coating, and then the second polymer layer is deposited over the QD layer by spin coating. See Mattousi, H., et al. (1998) 83:7965–7974, which is herein incorporated by reference. It should also be noted that the multilayer PQD-LEDs of the present invention may comprise more than three layers. For example, additional QD layers may be deposited over alternating polymer layers by methods known in the art. Alternatively, additional QD layers may be deposited directly over the first QD layer upon which the second polymer layer is deposited. The QDs of the additional QD layers may be the same or different from those of the first QD layer. In preferred embodiments, where multiple layers of QDs are in direct contact, not separated by a different layer such as a polymer layer, one QD layer is only soluble in aqueous solutions and the QD layers in direct contact with the aqueous soluble QD layer are only soluble in organic solvents. For example, the first QD layer is soluble in aqueous solutions, and the second QD layer is soluble in organic solvents, and the third QD layer is soluble in aqueous solvents, and the forth QD layer is soluble in organic solvents, and etc.

As disclosed herein, the multiple layers of the PQD-LED of the present invention is made possible by the formation of stable aqueous dispersion of QDs over which a solution of a polymer or other QDs in an organic solvent may be deposited using spin coating methods without affecting the layer of QDs underneath. Exemplified herein is a trilayer PQD-LED that was fabricated by sandwiching a few monolayers of CdSe—ZnS core-shell QDs between a hole conducting polymer polyvinyl carbazole (PVK) and electron conducting oxadiazole derivative tu-PBD. The trilayer PQD-LED of the present invention exhibits a threshold voltage of about 5V as compared with about 13V and a quantum efficiency of about 0.2% which is about 20 times more (or 3 orders higher) than a prior art single layer PQD-LED made from a blend of PVK, PBD, and uncapped CdSe QDs. See Dabbousi, B. O., et al. (1995) Appl. Phys. Lett. 66:1316, which is herein incorporated by reference.

The method for making the multilayer PQD-LEDs of the present invention is schematically shown in FIG. 1. As shown in FIG. 1, CdSe—ZnS core-shell QDs in toluene were purchased from Evident Technologies, NY. PVK is the first polymer layer. PVK is only soluble in organic solvents, such as chloroform. Spinning water on top was observed to have no effect on the PVK film thickness. Prior to the present invention, no one contemplated the possibility of functionalizing the QDs to render them hydrophilic in order to achieve a stable aqueous dispersion of QDs that may be deposited over a polymer layer or QD layer that is soluble in organic solvents. Since the stable aqueous dispersion of QDs is spin coated over a layer that is only soluble in organic solvents, the formation of the QD layer will not affect the layer upon which it is deposited. The stable aqueous disperson of the QDs of the present invention may be made by according to the method of Ravidran et al See Ravindran, S., et al (2003) Nano Lett. 3(4):447–453, which is herein incorporated by reference. This functionalization step also removed the organic trioctyl phosphine oxide (TOPO) layer from the ZnS shell and hence reduced the tunnelling barrier for charge injection during the electroluminescence process.

Then a transparent and conductive substrate of indium tin oxide (ITO) deposited quartz slide ($\Omega$ about 15 ohms) was etched in $HNO_3:H_2SO_4$ (1:5) to obtain 2 mm wide ITO lines. The slides were cleaned by sonication in detergent, water, acetone, isopropanol and methanol. The slides were then dried under nitrogen and stored in vacuum before device fabrication. PVK and tu-PBD were obtained from Aldrich. PVK was purified by precipitation and spun on ITO glass from chloroform to form the first 50 nm layer of the multilayer PQD-LED of the present invention. After drying at 60° C. in vacuum for 2 hours, the second layer of amine modified CdSe—ZnS QDs was spun on the top of PVK layer according to methods known in the art. The concentration of QDs and spin coating parameters were varied to obtain a few monolayers thick layer. See Mattousi, H., et al. (1998) J. Appl. Phys. 83:7965–7974, which is herein incorporated by reference. The layers were then annealed at 80° C. Annealing has shown to improve the close packing of nanocrystals, hence reducing the interdot tunnelling barrier for carriers. See Drndic, M., et al. (2002) J. Appl. Phys. 92:7498–7503, which is herein incorporated by reference. Finally, a top layer of tu-PBD was spun from toluene to form an electron conducting and hole blocking 30 nm thick layer. This layer also keeps the emissive QD layer away from the electrode and prevents quenching of emission. Thus, by virtue of QD functionalization process, none of the solvents had effect on the previous layer and three spin-coated layers were realized. No effect on the thickness of a layer was verified by unchanged photoluminescence peak intensity before and after spin coating the next layer.

Figure 2A:
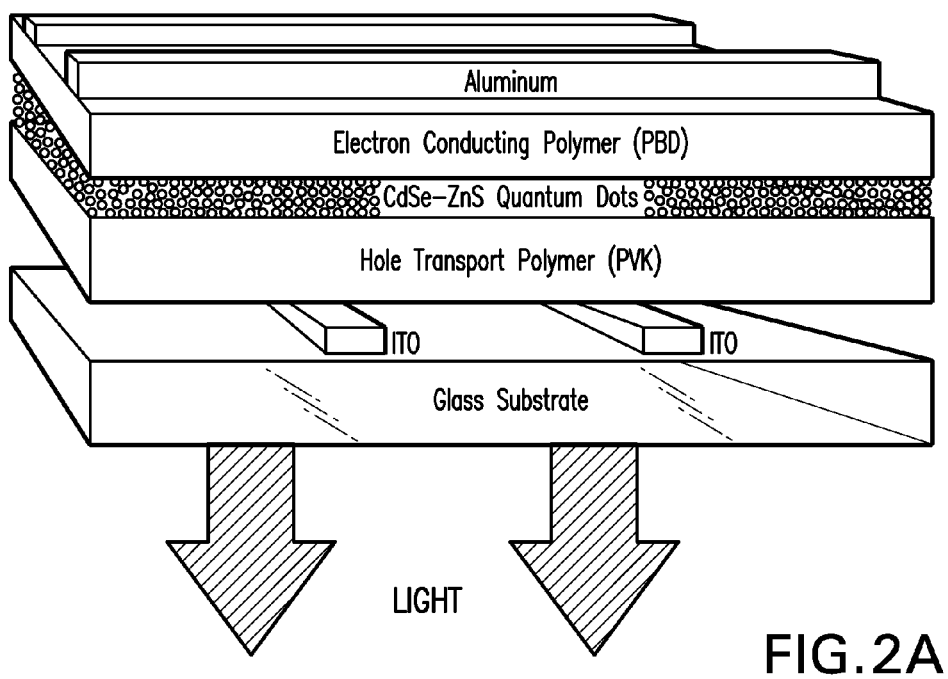
FIG. 2A shows a schematic of a trilayer PQD-LED of the present invention.
Figure 2B:
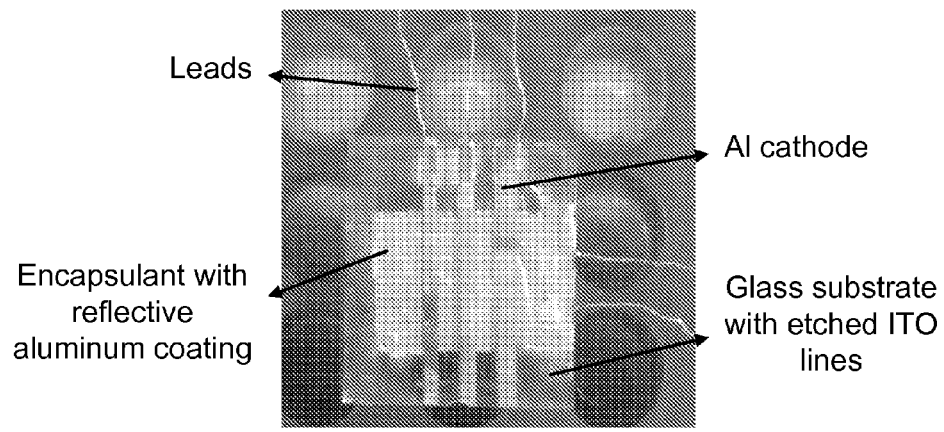
FIG. 2B shows a multilayer PQD-LED of the present invention.

After another drying process, the slides were shifted to a vacuum chamber, where 3 lines of aluminium electrode were evaporated on the top to form 9 LEDs on one substrate, each of which can be addressed individually. FIG. 2A schematically shows a trilayer PQD-LED of the present invention and FIG. 2B shows an PQD-LED of the present invention. After the fabrication of different layers, the LEDs were shifted to an argon atmosphere and encapsulated with a glass slide and epoxy using methods known in the art. Encapsulation has been shown to increase the lifetime of OLEDs. See Burrows, P. E., et al. (1994) Appl. Phys. Lett. 65(23):2922–2924, which is herein incorporated by reference. The LEDs (active area about 4 $mm^2$) were connected to a variable DC supply with the positive terminal connected to ITO. Optical spectra, both EL and PL, were collected in the Spex Fluorog-3 spectrofluorometer (Jobin Vyon, UK). A prior art control device was fabricated by spin casting a single layer of PVK-QD-PBD composite prepared according to the specifications of Dabbousi et. al. See Dabbousi, B. O., et al. (1995) Appl. Phys. Lett. 66:1316, which is herein incorporated by reference.

It should be noted that although ZnS capped CdSe QDs are exemplified herein, other QDs known in the art may also be used according to the present invention. Methods for functionalizing the QDs to be either hydrophilic or hydrophobic are known in the art and may be used to make the QDs soluble in either aqueous solvents or organic solvents. Likewise, other hole conducting polymers such as PEDOT: PSS, PPV and the like may be used in place of PVK and other electron conducting polymers such as flourene based copolymers containing quinoline (e.g. POF66 and P1F66) and pyridine (e.g. PFPV) units, and the like may be used in place of tu-PBD.

In preferred embodiments, the hole conducting polymer is PVK. The benefit of using PVK is that it is a blue-emitting material. The addition of a set of variable emitting QDs (green to red) in combination with the PVK (blue) provides a highly efficient and tunable LED as red, blue and green primary colors which give rise to the remaining colors in the visible spectrum.

Figure 3A:
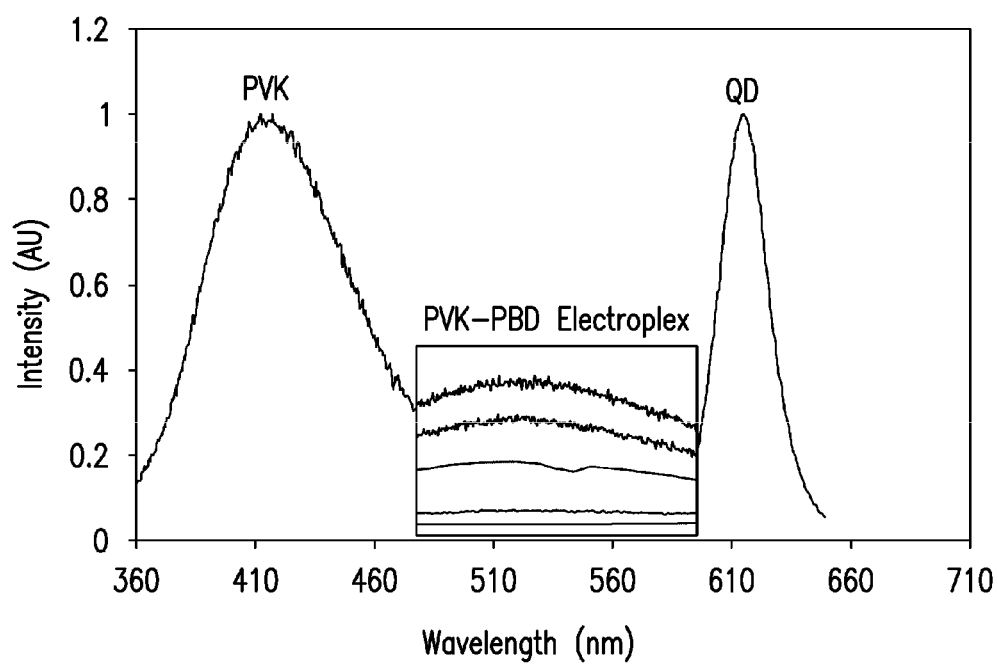
FIG. 3A shows the spectrum of a trilayer PVK-QD-PBD LED of the present invention. The inset shows a broad emission from PVK-PBD electroplex was observed in the wavelength range of about 470 nm to about 600 nm.

The EL spectrum of a trilayer PQD-LED of the present invention is shown in FIG. 3. The peak at 616 nm (red) is due to the emission from QD layer and the peak at 428 nm (blue) is due to the emission from PVK layer. Both the peaks are normalized to show the typical characteristic shape of the spectrum. The threshold voltage at which QDs started to emit was 5V. QD emission increased with increasing voltages. Initially, the spectrum is dominated by QD emission. As the voltage increases further, contribution from PVK emission increases and finally overshoots the QD emission. This is expected as with higher electric field, increasingly more electrons will leak into the PVK layer and recombination region inside PVK will grow. PVK and QD peaks in EL are similar to photoluminescence (PL) (not shown), except that the QD emission is slightly red shifted in EL due to the energetically preferential emission from larger QDs. FIG. 3A shows the spectrum for a medium voltage range. At lower voltages, QD emission at about 616 nm (FWHM about 30 nm) dominates the spectrum. As the voltage increases, PVK emission at about 428 (FWHM about 75 nm) monotonically increases and becomes greater than the QD emission. A broad emission from PVK-PBD electroplex between about 470 nm to about 600 nm was also observed. This has been reported before for oxidiazole-carbazole groups separated by sub nm distances. See Jiang, X., et al. (2002) J. App. Phys. 91(10):6717–6723, which is herein incorporated by reference.

Figure 3B:
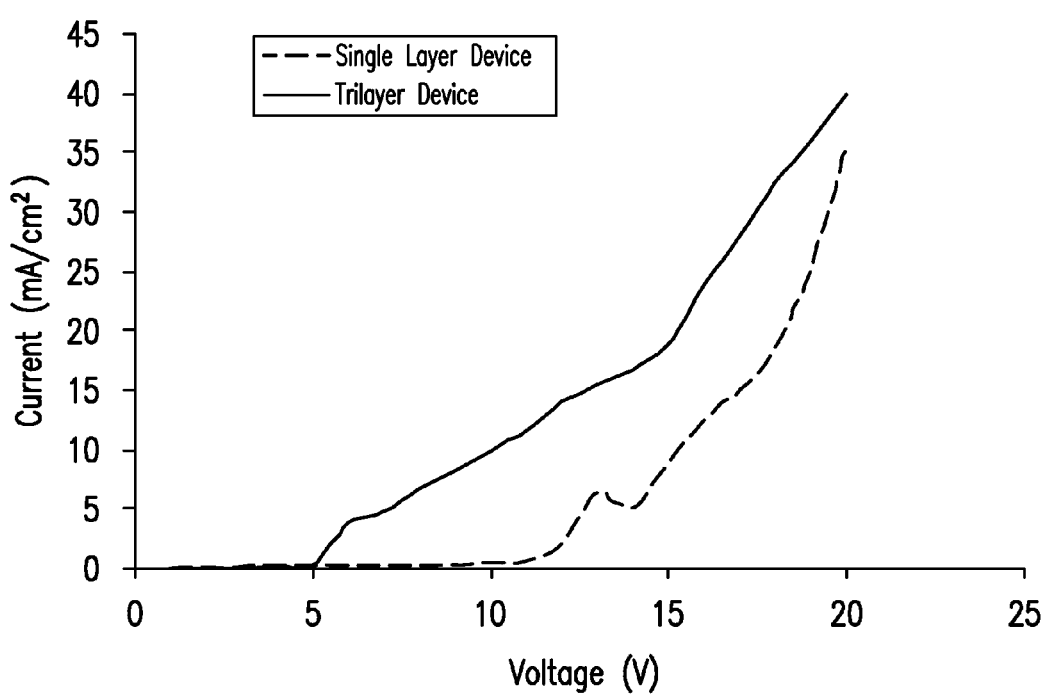
FIG. 3B shows the voltage as a function of current characteristics of the trilayer PQD-LED of the present invention and a prior art single layer LED.
Figure 4A:
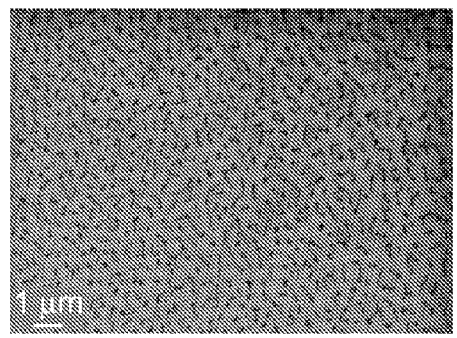
FIG. 4A is an SEM image of the spin coated QD film of the present invention showing imperfections in film and grain boundaries between annealed QD clusters.
Figure 4B:
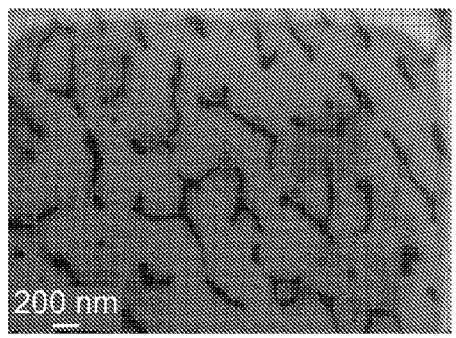
FIG. 4B is a magnification image of the grain boundaries and imperfections of the SEM image of FIG. 3A.
Figure 4C:
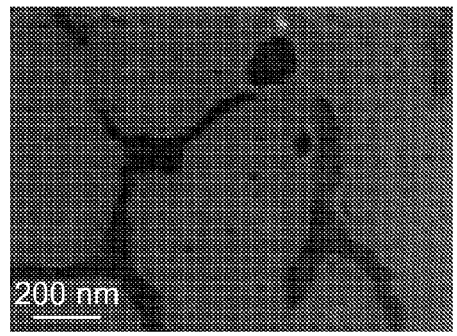
FIG. 4C is a magnification image of the grain boundaries and imperfections of the SEM image of FIG. 3A.
Figure 4D:
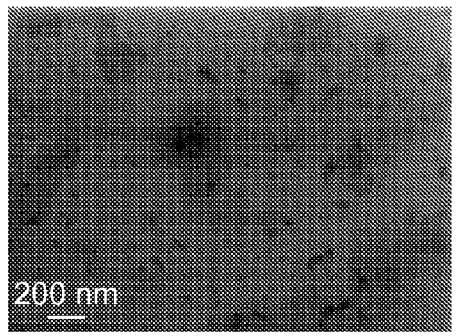
FIG. 4D is a magnification image of the grain boundaries and imperfections of the SEM image of FIG. 3A and single QDs can be seen clearly.

The electroplex emission was absent in the single layer control LED because all species, QDs and polymers, are mixed in the blend and electroplex emission does not occur in such a case. Besides that, the single layer LED showed a similar evolution of PVK and QD spectra, as in the trilayer PQD-LED of the present invention. The most striking difference was found in the threshold voltage. The single layer LED showed a threshold voltage of 13 volts, but it was drastically reduced to less than about half (about 5V) for the trilayer PQD-LED of the present invention as shown in FIG. 3B. The brightness of the trilayer PQD-LED of the present invention increases linearly with increasing current. The trilayer PQD-LED of the present invention also showed an external quantum efficiency of about 0.2%, which is about 20 times higher than the external quantum efficiency of the single layer control LED.

These experiments show that water soluble QDs tend to aggregate and form closely packed, organized structures. This clusterization behavior has previously been demonstrated at the interface of two dissimilar solvents, one of which contain QDs, and on the silicon substrate, when QDs are dispensed on it See Ravindran, S., et al. (2003) Nano Lett, 3(4):447–453; Murray, C. B., et al. (1995) Science 270:1335; and Kagan, C. R., et al. (1996) Phys. Rev. Lett. 76:1517, which are herein incorporated by reference. As provided herein, the clusterization was also enhanced due to slow evaporation of water from the QD layer, while spin coating. This behavior was characterized by SEM as shown in FIGS. 4A–4D. The close packing is further improved by annealing. See Drndic, M., et al. (2002) J. Appl. Phys. 92:7498–7503, which is herein incorporated by reference. This organized close packing of QDs reduces the tunnelling barrier of carriers, without affecting the optical properties of absorbance and emission of QDs. The injection and recombination efficiencies are also expected to increase. SEM images in FIGS. 4A–4D also show that the QD layer is not perfect and it has many streaks of imperfections, voids and grain boundaries.

To understand the underlying phenomena behind the electro-optical behavior of the trilayer PQD-LED of the present invention and the control single layer PQD-LED, the energy level diagram of the trilayer PQD-LED components was analyzed. As reported previously, CdSe—ZnS QDs act as deep electron traps. Electrons coming through the PBD layer fall in the deep traps of CdSe QDs and are blocked by large energy barriers at the QD-PVK interface and at the ZnS shells within the QD layer itself. Holes cross into the QD layer through a relatively small energy barrier at the PVK-QD interface. The injection of holes into the QD layer is further strengthened by the enhanced electric field between the positive ITO electrode and negatively charged electrons in the QD layer.

Thus, both holes and electrons are mainly restricted in the QD layer and this enhances the recombination efficiency and the quantum efficiency of the trilayer PQD-LED compared with the single layer control LED. In the single layer PQD-LED, QDs are evenly and monodispersively spread throughout the composite layer and a large number of carriers passes through the device layer to the opposite electrode through the organic pathway, without encountering a QD. This also explains the predominance of PVK emission in the single layer LEDs. As mentioned before and shown in FIGS. 4A–4D, the QD layer in the trilayer PQD-LED of the present invention comprises organized aggregates of QDs, with the presence of many grain boundaries, interstitial imperfections and voids. Two organic species are in close contact with each other at these sites. This leads to a broad emission from the electroplex formed between PVK and PBD as shown in FIG. 3A. Also, excitons formed at the interface can also laterally transfer to the lower energy QDs through Förster energy transfer and recombine radiatively. In the single layer control LED, QDs have a TOPO passivation layer, which is a larger energy barrier than the amine chain on the functionalized water soluble dots. This is further responsible for the higher threshold voltage of the single layer control LED.

The threshold voltage, brightness and external quantum efficiency of the trilayer PQD-LED exemplified herein is still below the maximum theoretical limits. Performance can further be improved by using a low work function cathode and using polymers with better electro-optical characteristics and carrier mobilities. With these choices, the same molecular design can be used to spin coat a sandwich layer of CdSe—ZnS QDs from aqueous solution, between two polymers or organic species. The methodology can be extended to fabricate multilayer structures, which are most suitable for incorporating different sized QDs in organic species, towards obtaining saturated full color and voltage tunable light emitting displays. See Huang, J., et al. (2002) Appl. Phys. Lett. 80:139, which is herein incorporated by reference.

Figures 5A, 5B:
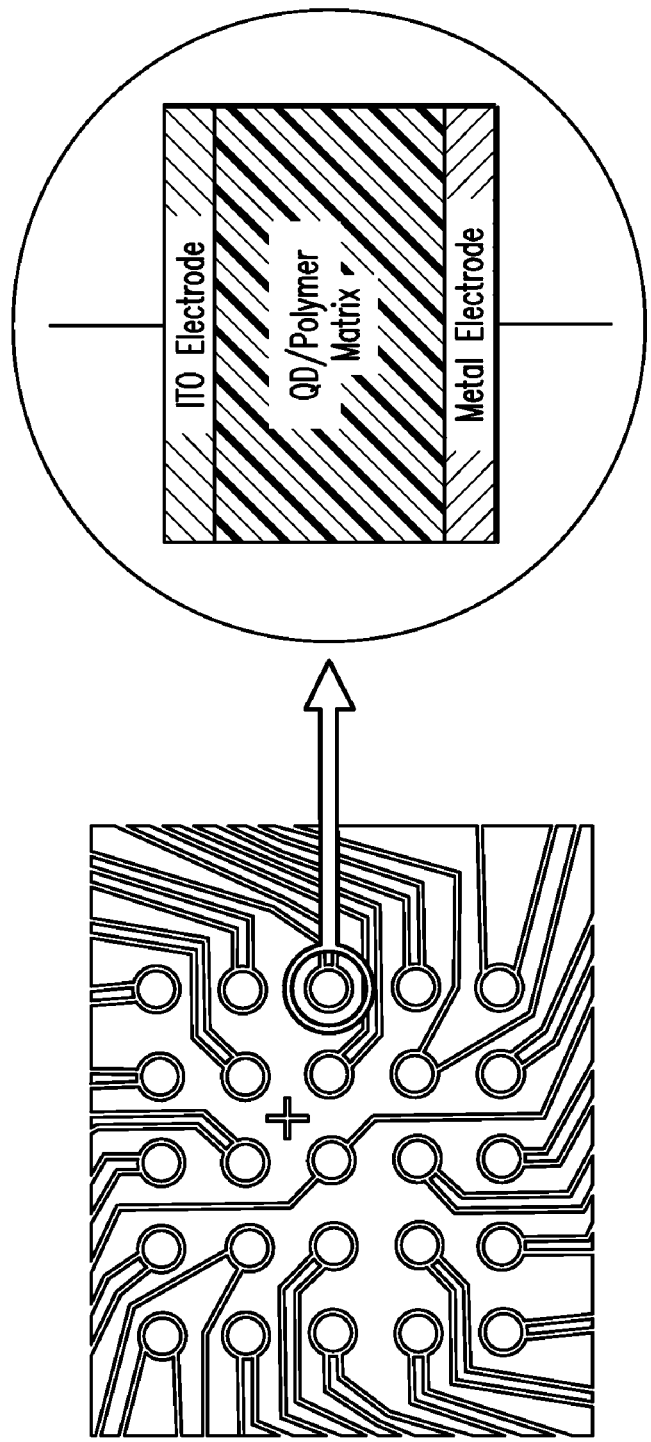
FIG. 5 shows an energy level diagram of trilayer PQD-LED. The pathways of holes and electrons are shown by arrows. Corresponding dots are shown in the CdSe region to emphasize the excess of carriers and recombination in the QD layer.
Figure 6A:
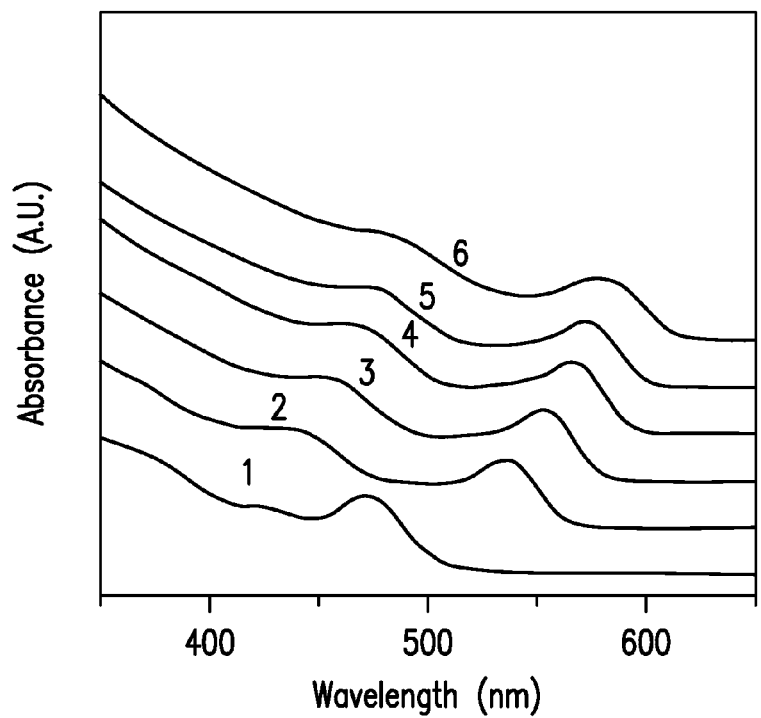
FIG. 6A shows the absorbance spectrum of (1) 28 Å, (2) 34 Å, (3) 37 Å, (4) 40 Å, (5) 44 Å, and (6) 50 Å core size CdSe/ZnS core/shell QDs.
Figure 6B:
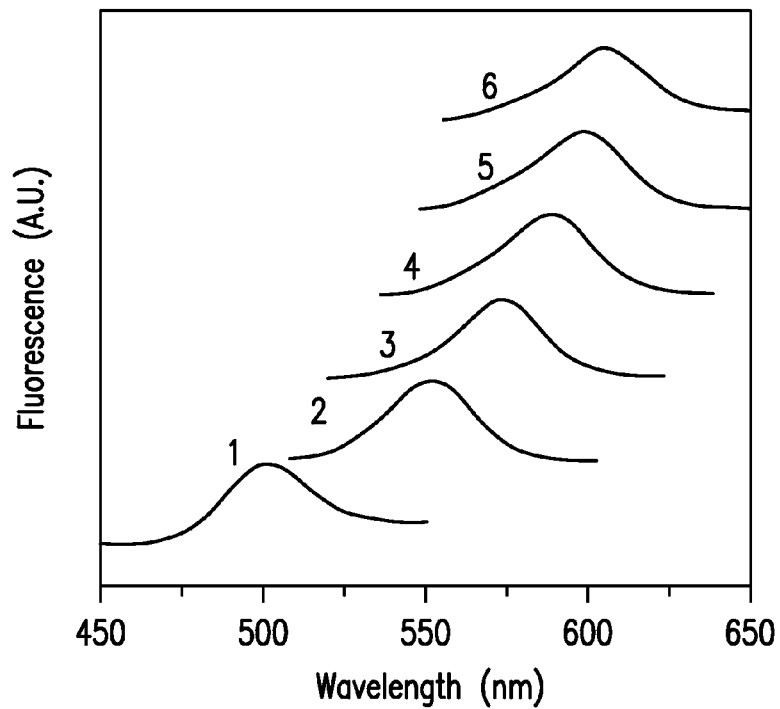
FIG. 6B shows the emission spectrum of (1) 28 Å, (2) 34 Å, (3) 37 Å, (4) 40 Å, (5) 44 Å, and (6) 50 Å core size CdSe/ZnS core/shell QDs.

FIG. 5 shows a schematic of a QD array of the present invention. Different sizes of QDs may be incorporated in a conducting polymer film using methods known in the art and then sandwiched between a metal (Al/Mg) and indium tin oxide (ITO) electrodes and employed in the a multilayer PQD-LEDs according to the present invention. The color of the pixels (QDs) can be tuned by changing the voltage applied to the electrodes. Different size QDs will start electroluminescing at different threshold voltages, with emission wavelength increasing and threshold voltage decreasing with increase in size. The effect of size tunability and can be seen in absorption and emission spectrums of different size QDs in FIGS. 6A and 6B. Thus by changing the voltage, emission color of each pixel can be tuned in the full visible spectrum and an array of color tunable pixels can be obtained. Emission color of QDs can be tuned in the full visible spectrum by varying their size from about 3 nm to about 10 nm. With decreasing size, their energy increases in accordance with uncertainty principle, band gap opens up and electron affinity decreases. Thus different size QDs will emit at different threshold voltages and full color visible spectrum can be obtained from QDs prepared by the same synthetic route. Alternatively, QDs having other cores and shells may be used to provide other emission colors. For example, CdSe—CdS core-shell QDs. See Schlamp, M. C., et al. (1997) 82:5837–5842, which is herein incorporated by reference.

Kits comprising reagents useful for performing the methods of the invention are also provided. In one embodiment, a kit comprises the multilayer PQD-LEDs of the present invention packaged together with instructional material. In some embodiments the kit comprises stable aqueous suspensions of QDs and reagents for making the multilayer PQD-LEDs of the present invention.

To the extent necessary to understand or complete the disclosure of the present invention, all publications, patents, and patent applications mentioned herein are expressly incorporated by reference therein to the same extent as though each were individually so incorporated.

Having thus described exemplary embodiments of the present invention, it should be noted by those skilled in the art that the within disclosures are exemplary only and that various other alternatives, adaptations, and modifications may be made within the scope of the present invention. Accordingly, the present invention is not limited to the specific embodiments as illustrated herein, but is only limited by the following claims.

We claim:

1. A multilayer polymer-quantum dot light emitting diode comprising at least one aqueous solvent soluble quantum dot layer of aqueous solvent soluble quantum dots between a first non-polar solvent soluble polymer layer and a second non-polar solvent soluble layer which is a spun coat polymer layer or a spun coat organic molecule layer.

2. The multilayer polymer-quantum dot light emitting diode of claim 1, wherein the quantum dot layer was formed using an aqueous suspension of quantum dots.

3. The multilayer polymer-quantum dot light emitting diode of claim 2, wherein the aqueous suspension of quantum dots is stable.

4. The multilayer polymer-quantum dot light emitting diode of claim 1, wherein the quantum dots are hydrophilic.

5. The multilayer polymer-quantum dot light emitting diode of claim 1, wherein at least one of the polymer layers comprises a low molecular weight compound selected from the group consisting of polyaromatics and polyheteroaromatics.

6. The multilayer polymer-quantum dot light emitting diode of claim 1, wherein at least one of the polymer layers comprises conjugated polymers.

7. The multilayer polymer-quantum dot light emitting diode of claim 1, wherein the first polymer layer comprises a hole conducting polymer.

8. The multilayer polymer-quantum dot light emitting diode of claim 1, wherein the second polymer layer comprises an electron conducting polymer.

9. The multilayer polymer-quantum dot light emitting diode of claim 1, wherein the organic molecule layer comprises an electron conducting organic molecule.

10. The multilayer polymer-quantum dot light emitting diode of claim 1, wherein the first polymer layer comprises polyvinyl carbazole (PVK).

11. The multilayer polymer-quantum dot light emitting diode of claim 1, wherein the second polymer layer comprises tu-PBD.

12. The multilayer polymer-quantum dot light emitting diode of claim 2, wherein the quantum dots comprise a first element selected from Groups 2 and 12 of the Periodic Table of the Elements and a second element selected from Group 16.

13. The multilayer polymer-quantum dot light emitting diode of claim 2, wherein the quantum dots comprise a first element selected from Group 13 of the Periodic Table of the Elements and a second element selected from Group 15.

14. The multilayer polymer-quantum dot light emitting diode of claim 2, wherein the quantum dots comprise an element selected from Group 14 of the Periodic Table of the Elements.

15. The multilayer polymer-quantum dot light emitting diode of claim 2, wherein the quantum dots comprise an outer surface which is hydrophilic.

16. The multilayer polymer-quantum dot light emitting diode of claim 2, wherein the quantum dots comprise ZnS capped CdSe quantum dots.

17. The multilayer polymer-quantum dot light emitting diode of claim 1, wherein the second polymer layer was deposited by spin coating.

18. The multilayer polymer-quantum dot light emitting diode of claim 1, which further comprises more than one quantum dot layer between the first non-polar solvent soluble polymer layer and the second non-polar solvent soluble layer wherein the aqueous solvent soluble quantum dot layers of aqueous solvent soluble quantum dots alternate with non-polar solvent soluble quantum dot layers of non-polar solvent soluble quantum dots.

19. The multilayer polymer-quantum dot light emitting diode of claim 1, wherein at least one aqueous solvent soluble quantum dot layer of aqueous solvent soluble quantum dots is deposited on top of the second non-polar solvent soluble layer.

20. The multilayer polymer-quantum dot light emitting diode of claim 1, which comprises a plurality of one aqueous solvent soluble quantum dot layer of aqueous solvent soluble quantum dots between a first non-polar soluble polymer layer and a second non-polar soluble layer which is a polymer layer or a spun coat organic molecule layer.

21. The multilayer polymer-quantum dot light emitting diode of claim 1, wherein one of the quantum dot layers comprises quantum dots that are the same or different from quantum dots in another quantum dot layer.

22. The multilayer polymer-quantum dot light emitting diode of claim 1, wherein the first polymer layer comprises PVK, the quantum dot layer comprises an aqueous suspension of ZnS capped CdSe quantum dots, and the second polymer layer comprises tu-PBD that was deposited on the quantum dot layer by spin coating.

23. A method of making the multilayer polymer-quantum dot light emitting diode of claim 1, which comprises depositing the quantum dot layer on the first polymer layer and then depositing the spun coat second polymer layer on the quantum dot layer by spin coating.

24. The method of claim 23, and further comprising depositing the quantum dot layer as an aqueous suspension of quantum dots.

25. The method of claim 24, and further comprising making the aqueous suspension of quantum dots by making the quantum dots hydrophilic.

26. A device which comprises the multilayer polymer-quantum dot light emitting diode of claim 1.

27. A kit which comprises the multilayer polymer-quantum dot light emitting diode of claim 1 and instructional material.

28. A kit which comprises at least one reagent for making the multilayer polymer-quantum dot light emitting diode of claim 1 and instructional material.

29. The kit of claim 28, wherein the reagent is an aqueous suspension of quantum dots.

* * * * *